United States Patent [19]
Maitland et al.

[11] Patent Number: 5,561,692
[45] Date of Patent: Oct. 1, 1996

[54] CLOCK PHASE SHIFTING METHOD AND APPARATUS

[75] Inventors: Roger J. Maitland, Woodlawn; Hal H. Ireland, Kanata, both of Canada

[73] Assignee: Northern Telecom Limited, Montreal, Canada

[21] Appl. No.: 163,643

[22] Filed: Dec. 9, 1993

[51] Int. Cl.$^6$ .................................................. H04L 7/027
[52] U.S. Cl. ...................... 375/371; 375/373; 327/152; 327/153; 331/57; 370/108; 370/105.3
[58] Field of Search .................................. 375/359, 371, 375/373, 376; 327/144, 152, 153, 161; 331/1 R, 10, 14, 18, 25, 57; 370/100.1, 105.3, 108, 112

[56] References Cited

U.S. PATENT DOCUMENTS

| | | | |
|---|---|---|---|
| 4,677,648 | 6/1987 | Zurflur | 375/376 |
| 4,821,297 | 4/1989 | Bergmann et al. | 375/376 |
| 5,018,169 | 5/1991 | Wong et al. | 375/373 |
| 5,077,529 | 12/1991 | Ghoshal et al. | 375/371 X |
| 5,220,581 | 6/1993 | Ferraiolo et al. | 375/226 |

*Primary Examiner*—Young T. Tse
*Attorney, Agent, or Firm*—Dallas F. Smith; F. P. Turpin

[57] ABSTRACT

A circuit for providing a phase controlled clock output includes a ring oscillator having a delay line for providing an internal clock signal whose period varies with on-chip variations due to temperature, voltage, and process. The circuit also includes a clock phase select circuit having a counter and divider for determining the number of delays in one external clock period and an input for a phase select value. A delay line having delay elements similar to those of the ring oscillator provides multiple delayed clock signals from the reference clock signal. A multiplexor having odd and even sides is used to select the desired clock signal in a glitchless manner. The phase controlled clock signal output is controlled by the phase select signal and is compensated for on-chip variations due to temperature, voltage, and process.

9 Claims, 4 Drawing Sheets

CLOCK PHASE SHIFTING METHOD AND APPARATUS

FIELD OF THE INVENTION

This invention relates to method and apparatus for phase shifting a reference clock signal and is particularly concerned with providing a phase controlled clock signal which is relatively stable over a range of variations caused temperature, process, and voltage.

BACKGROUND TO THE INVENTION

Silicon CMOS integrated circuits introduce wide time differences or deltas between their best case propagation delays and their worst case propagation delays. The deltas are primarily due to operating temperature variation, supply voltage variation and chip processing variation.

SUMMARY OF THE INVENTION

An object of the present invention is to provide an improved circuit for phase shifting a reference clock signal.

In accordance with an aspect of the present invention there is provided a method of providing a phase controlled clock signal, in an integrated circuit comprising the steps of: providing an internal reference clock signal generated on-chip; providing an external reference clock signal generated off-chip having a period shorter than that of internal reference clock signal; determining an integral number of external reference clock signal periods in one internal reference clock signal period; providing a phase select value indicative of a desired phase shift from the external reference clock signal; providing a plurality of delayed clock signals derived from the external reference clock signal; and selecting one of the plurality of delayed clock signals in dependence upon the integral number of external reference clock signal periods and the phase select value.

Preferably, the step of providing an internally generated reference clock signal includes the steps of providing an on-chip ring oscillator, including a delay line, and having a clock signal period $T_{ocs}$, which is dependent upon temperature, process, and voltage variations and frequency dividing the clock signal by an integral value n to provide the internal reference clock signal having a period $nT_{osc}$.

Preferably, the step of providing a plurality of delayed clock signals includes the steps of providing a delay line having a plurality of delay cells similar to the delay line of the ring oscillator, inputting the external reference clock signal into the delay line, tapping the delay line after each of the plurality of delay cells to provide the plurality of delayed clock signals.

Conveniently, the step of selecting includes subtracting from the number of delays a predetermined delay to compensate for delay in selecting.

In accordance with another aspect of the present invention there is provided an apparatus for providing a phase controlled clock signal on an integrated circuit comprising: a ring oscillator including a delay line for providing an internal reference clock signal; an input for an external clock signal; an input for a phase select value; a circuit for determining an integral number of delays in one period of the external clock signal, connected to the ring oscillator and the input for the external clock signal; a circuit for deriving a number of delays for the desired phase shift, connected to the circuit for determining an integral number of delays and the input for a phase select value; a multitapped delay line connected to the input for the external clock signal for providing a plurality of delayed clock signals; and a multiplexor connected to the multitapped delay line and the circuit for deriving a number of delays for selecting one of the plurality of delayed clock signals.

Preferably, the circuit for determining an integral number of delays includes a counter connected to the ring oscillator and the input for the external clock signal and having an output and a divider connected to the output of the counter for dividing a value from the counter by a predetermined integer characteristic of the ring oscillator.

Preferably, the circuit for deriving a number of delays for a desired phase shift includes a multiplier connected having a first input connected to the circuit for determining an integral number of delays and a second input connected to the input for a phase select value and an output for a number of delays value.

Conveniently, the circuit for deriving a number of delays for a desired phase shift includes a subtractor connected to the output for a number of delays value for subtracting from the value a predetermined delay.

An advantage of the present invention is providing a desired clock phase output for a given phase select value. The programmable nature of the phase selection allows embodiments of the present invention to be implemented in a variety of integrated circuit technologies, in entirely digital circuits, which can be tested using digital testing techniques.

BRIEF DESCRIPTION OF THE DRAWINGS

The present invention will be further understood from the following description with reference to the drawings in which.

DETAILED DESCRIPTION

Figure 1:
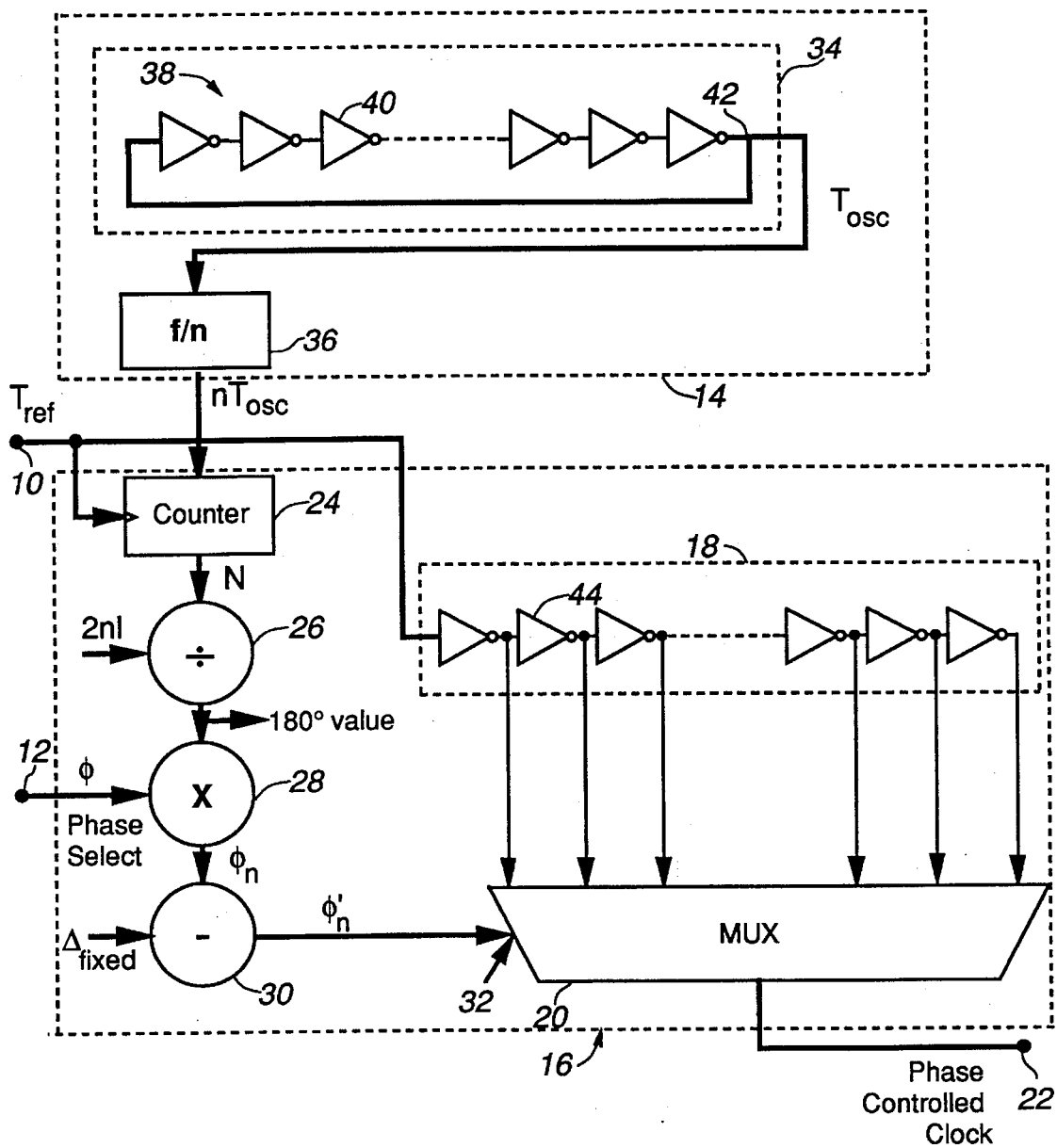
FIG. 1 illustrates, in a block diagram, a clock phase shifting circuit in accordance with an embodiment of the present invention.

Referring to FIG. 1, there is illustrated, a clock phase shifting circuit in accordance with an embodiment of the present invention. The circuit includes a clock input 10, a phase selection input 12, an internal clock circuit 14, and a clock phase selection circuit 16. The clock phase selection circuit 16 includes a multitapped delay line 18 and a multiplexor (MUX) 20 for providing a phase controlled clock output at an output 22. The clock phase selection circuit 16 also includes, in series connection, a counter 24, a divider 26, a multiplier 28, and a subtractor 30. The clock input 10 and the internal clock circuit 14 are connected to the counter 24. The phase selection input 12 is connected to the multiplier 28. The output of the subtractor 30 is connected to a select input 32 of the MUX 20.

The internal clock circuit 14 includes a ring oscillator 34 and a frequency divider 36, that together provide the internal reference clock connected to the counter 24. The ring oscillator 34 comprises a delay line 38 having a plurality of series connected buffers 40 and a feedback path 42.

The multitapped delay line 18 comprises a plurality of series connected buffers 44. The buffers 40 and 44 are identical in the respect that delays through them are the same and are equally affected by process, temperature and voltage variations. The multitapped delay line 18 is tapped following each buffer 44, with each tap connected to inputs of the MUX 20.

In operation, the circuit of FIG. 1 provides a phase controlled clock signal from a reference clock signal in response to a phase selection value. The reference clock signal, having a clock period $T_{ref}$, is applied to the clock input 10 and the phase selection value $\phi$, ranging from 0 to 1, is applied to the phase selection input 12. The reference clock signal is also applied to the multitapped delay line 18 to produce multiple phase-shifted clocks which are input to the MUX 20 for selection of the desired clock phase to be provided at the output 22 as the phase controlled clock signal. The selection of the desired clock phase is dependent upon the output of the ring oscillator 34 and the phase select value at input 12. The ring oscillator 34 is used to monitor the variation in buffer delay due to process, temperature, and voltage. The phase select value ranges from 0 to 1 corresponding to a desired clock phase 0° to 360°, respectively, relative to the reference clock signal.

For the ring oscillator 34, given that the delay through each of the plurality of buffers 40 is $\delta$, and there are l buffers in the delay line, the period of oscillation of the ring oscillator, $T_{osc}$, is given by:

$$T_{osc} = 2l\delta \qquad (1).$$

Since $T_{osc}$ is directly proportional to buffer delay $\delta$, variations in the buffer delay $\delta$ can be monitored by monitoring the ring oscillator period $T_{osc}$. A convenient way to monitor $T_{osc}$ is to measure the number of reference clock periods, $T_{ref}$, in one oscillator period, $T_{osc}$. However, as the sampling error is proportional to $T_{ref}/T_{osc}$, it is preferred to lengthen the period being sampled. In the embodiment of the invention of FIG. 1, this is accomplished by the frequency divider 36. The output of the frequency divider 36 provides an internal clock signal having a period, $nT_{osc}$, where n is the integral divisor used by the frequency divider 36. The lengthened oscillator period is still proportional to the buffer delay $\delta$ and can be used to monitor it. The counter 24 uses the internal clock period $nT_{osc}$ to determine a number, N, of reference clock periods $T_{ref}$ in one internal clock period. Thus, N is given by:

$$N = \frac{nT_{osc}}{T_{ref}} = \frac{2l\delta n}{T_{ref}} \qquad (2)$$

assuming the sampling error is small enough to ignore. The propagation delay through a single buffer 38 is given by:

$$\delta = \frac{NT_{ref}}{2nl} \qquad (3)$$

If identical elements, with respect to delay, are used in the ring oscillator 34 and the multitapped delay line 18, then: $\delta_{osc} = \delta_{delayline}$, with an error proportional to the skew in process, temperature and voltage across the chip.

The output of counter 24, N, is applied to the divider 26 as the divisor. The dividend used by the divider 26 is the constant 2 nl. The output of divider 26, the quotient 2 nl/N, which approximately equals the ratio $T_{ref}/\delta$ (ignoring the sampling error), is applied as input to the multiplier 28.

The phase selection value $\phi$, which ranges from 0 to 1, is used to provide the programmed internal delay $\Delta_{prog}$, and provides the desired clock phase given by:

$$\Delta_{prog} = \phi T_{ref} \qquad (4).$$

A number of delay elements, $\phi_n$, required to produce the programmed internal delay, $\Delta_{prog}$, is given by:

$$\phi_n = \frac{\Delta_{prog}}{\delta} = \frac{2nl\phi T_{ref}}{NT_{ref}} = \frac{2nl\phi}{N} \qquad (5)$$

In the phase selection circuit 16, the phase selection value $\phi$ is used by the multiplier 28 to multiply 2 nl/N to provide the number $\phi_n$ to be applied to the subtracter 30. The number $\phi_n$ could be used to select the number of buffer 44 delays by applying it directly to the select input 32 of MUX 20 if there were no additional delays introduced by the clock phase selection circuit 16 and the MUX 20. These additional delays also vary with process, temperature and voltage. By using circuitry in the clock phase selection circuit 16 and the MUX 20 that varies in the same way as the ring oscillator 34, the additional delays through the circuitry can be represented, with a maximum error of one-half $\delta$ as an integral number of buffer 44 delays, 67 $_n$.

The integral number of buffer 44, delays can be thought of, in terms of buffer delays $\delta$, as a fixed delay value, equal to and representative of additional delays through the circuitry used in the clock phase selection circuit 16 and the MUX 20. The fixed delay value, is therefore representative of a number of buffers $\Delta$ fixed, each having a delay required compensate for the additional internal circuit delay. The additional delays introduced by the clock phase selection circuit 16 and the MUX 20 are compensated for by subtracting the number of buffers $\Delta$ fixed, corresponding to the fixed delay value, from the number of delay elements (buffers 44) required to produce the programmed internal delay, $\Delta$prog compensated number of delay elements, $\phi'_n$, is given by:

$$\phi_n' = \frac{2nl\phi}{N} - \Delta_{fixed}. \qquad (6)$$

Both N and $\phi_n$ involve sampling that introduces errors of as much as one-half of their least significant bit. Thus the equation for $\delta$ (equation 3) and the equation for $\phi n$ (equation 5) become the following when sampling errors are considered:

$$\delta = \frac{T_{ref}}{2nl}\left(N \mp \frac{1}{2}\right) \qquad \text{(7) and (8)}$$

$$\phi_n = \frac{\phi T_{ref}}{\delta} \pm \frac{1}{2}.$$

By substituting equation 7 into equation 8, a maximum error in selected phase, $\xi$, is given by:

$$\xi = \pm\left(\frac{1}{2} + \frac{4nl}{4N^2 - 1}\right). \qquad (9)$$

In a particular embodiment of the present invention, the ring oscillator 34 includes inverters connected back-to-back with the load on each controlled to be equal to the load on the inverters of the delay line 18. The ring oscillator includes circuitry to allow it to be reset to a known state so that multiple oscillations can be cleared without powering down. The total length of the ring oscillator, l, is 35.

In a particular embodiment of the present invention, the frequency divider 36 includes six flip-flops clocking each other thereby providing a clock output divided down by n=64.

In a particular embodiment of the present invention, the counter 24 used to generate the value of N comprises a 9-bit binary counter. The counter counts for a complete oscillation of the internal clock period $nT_{osc}$. The counter is capable of starting on a rising or falling edge thereby reducing synchronization delay with the asynchronous output of the frequency divider.

With regard to the particular embodiment of the present invention having l=35 and n=64, the maximum phase error given by equation 9 are summarized in Table A.

TABLE A

| Frequency of Operation | Process Variation | Value of N | Maximum Phase Error |
|---|---|---|---|
| 16 MHz | worst | 47 | 1.0 ns |
|  | best | 14 | 2.4 ns |
| 25 MHz | worst | 74 | 0.6 ns |
|  | best | 22 | 1.0 ns |
| 33 MHz | worst | 89 | 0.5 ns |
|  | best | 27 | 0.7 ns |
| 40 MHz | worst | 118 | 0.4 ns |
|  | best | 36 | 0.4 ns |

Figure 2:
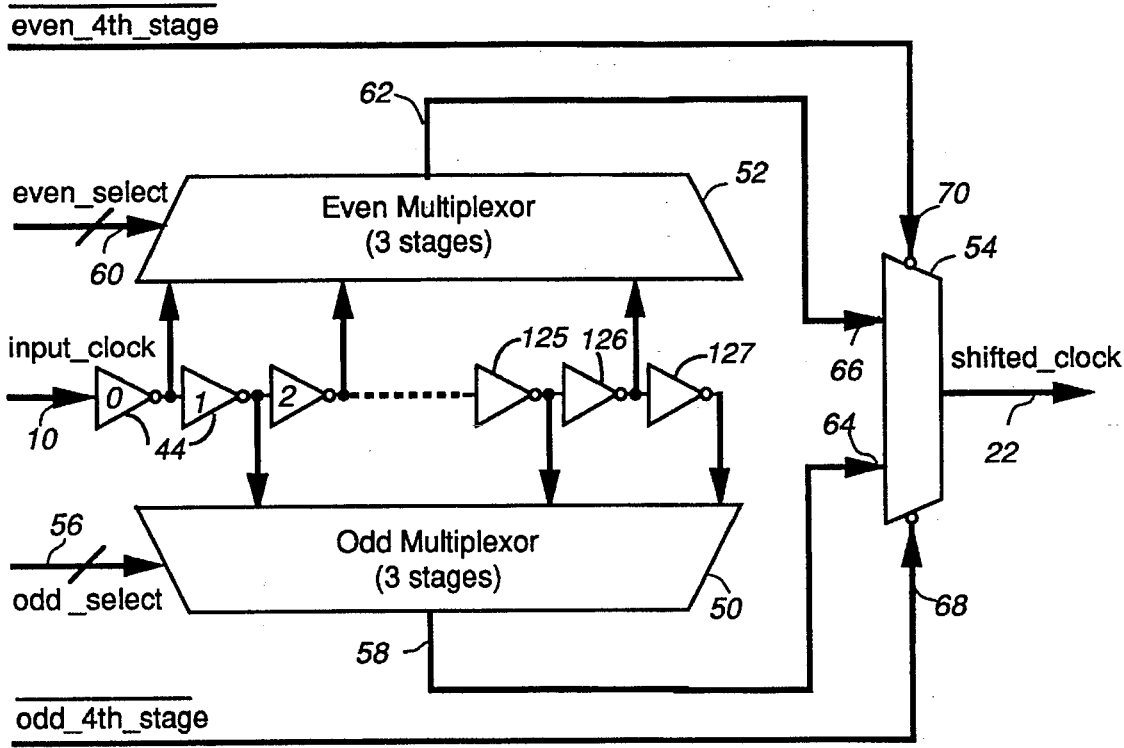
FIG. 2 illustrates, in a block diagram, the multitapped delay line and multiplexor of FIG. 1.

Referring to FIG. 2, there is illustrated, in a block diagram, the multitapped delay line 18 and MUX 20 of FIG. 1 in accordance with a preferred embodiment of the present invention. The Mux 20 includes odd and even multiplexors 50 and 52, each having three cascaded stages and a shared fourth stage multiplexor 54. The odd multiplexor 50 includes inputs from odd inverters 44, an odd select input 56, and an output 58. The even multiplexor 52 includes inputs from even inverters 44, an even select input 60, and an output 62. The fourth stage multiplexor 54 includes inputs 64 and 66 from the odd and even multiplexors 50 and 52, respectively, odd and even select inputs 68 and 70, respectively, and the phase controlled clock output 22. In the preferred embodiment, the multitapped delay line 18 includes 128 inverters connected back-to-back, each having a three-state buffer output. The load on each inverter is identical to that of the inverters of the ring oscillator.

The MUX 20 has the following attributes: equal delay through all paths, any of 128 delay line inputs selectable from which buffered and inverted versions are created, effectively doubling the number of delay line inputs, and an ability to move to adjacent inputs without introducing glitches into the clock output.

In operation, the reference clock signal, at input 10, enters the multitapped delay line 18 and progresses through all 128 inverters 44. The outputs from inverters numbered 0, 2, 4, . . . , 126 enter the even multiplexor 52, the outputs from inverters numbered 1, 3, 5, . . . , 127 enter the odd multiplexor 50. The first stage of each multiplexor 50 and 52 reduces these 64 inputs into 8 possible selections. Each of these is buffered and inverted to create 16 signals. These 16 signals pass through two additional levels of multiplexing until a single signal is selected from the odd and even multiplexors 50 and 52 and provided at outputs 58 and 62, respectively. The fourth stage multiplexor 54 selects between these two signals, making the transition once the inactive half of the multiplexor has stabilized.

Equal delay through all paths is achieved by careful selection of the components in the clock path and by control of the circuit layout to ensure equal loading, as is known to one of ordinary skill in the art.

Glitchless transition between adjacent input is achieved by dividing the MUX 20 into two halves, one odd and one even. As moving to an adjacent input means going from an odd input to an even one, or vice versa, the multiplexor freezes the active half while the inactive half is being set up. Once the inactive half has been set up and all glitches have had time to settle out, the fourth stage multiplexor 54 makes the odd-to-even or even-to-odd transition while the clock signal is low.

The doubling of input signals (buffering and inverting) within the MUX 20 provides an economy of gates that takes advantage of the fact that an inverted clock signal is the same as one delayed 180 degrees. This is possible if the clock signal has a 50% duty cycle and the delay through the inverter is accounted for.

Figure 5:
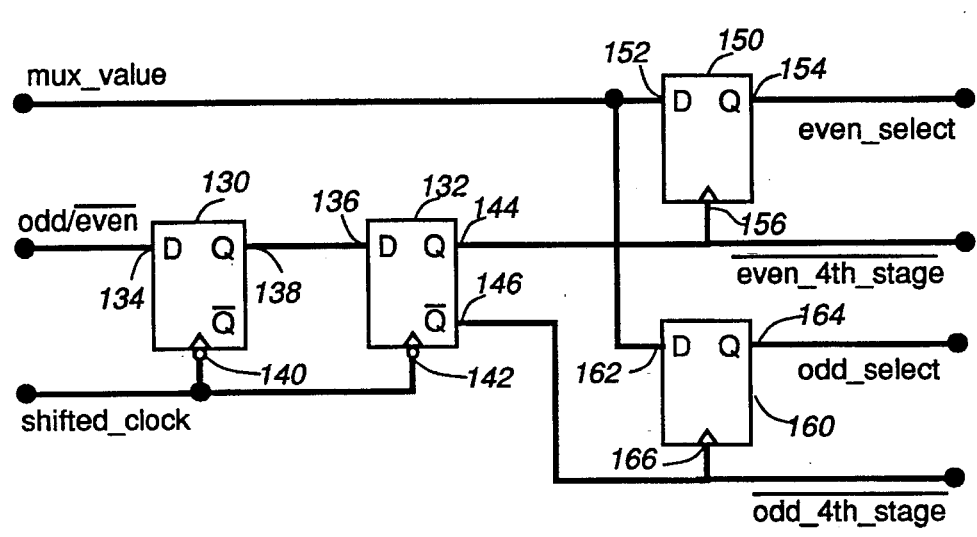
FIG. 5 schematically illustrates the circuit for converting the mux-value, odd/NOT even signals to even-select, odd-select, NOT even-4th-stage and NOT odd-4th-stage.
Figure 3:
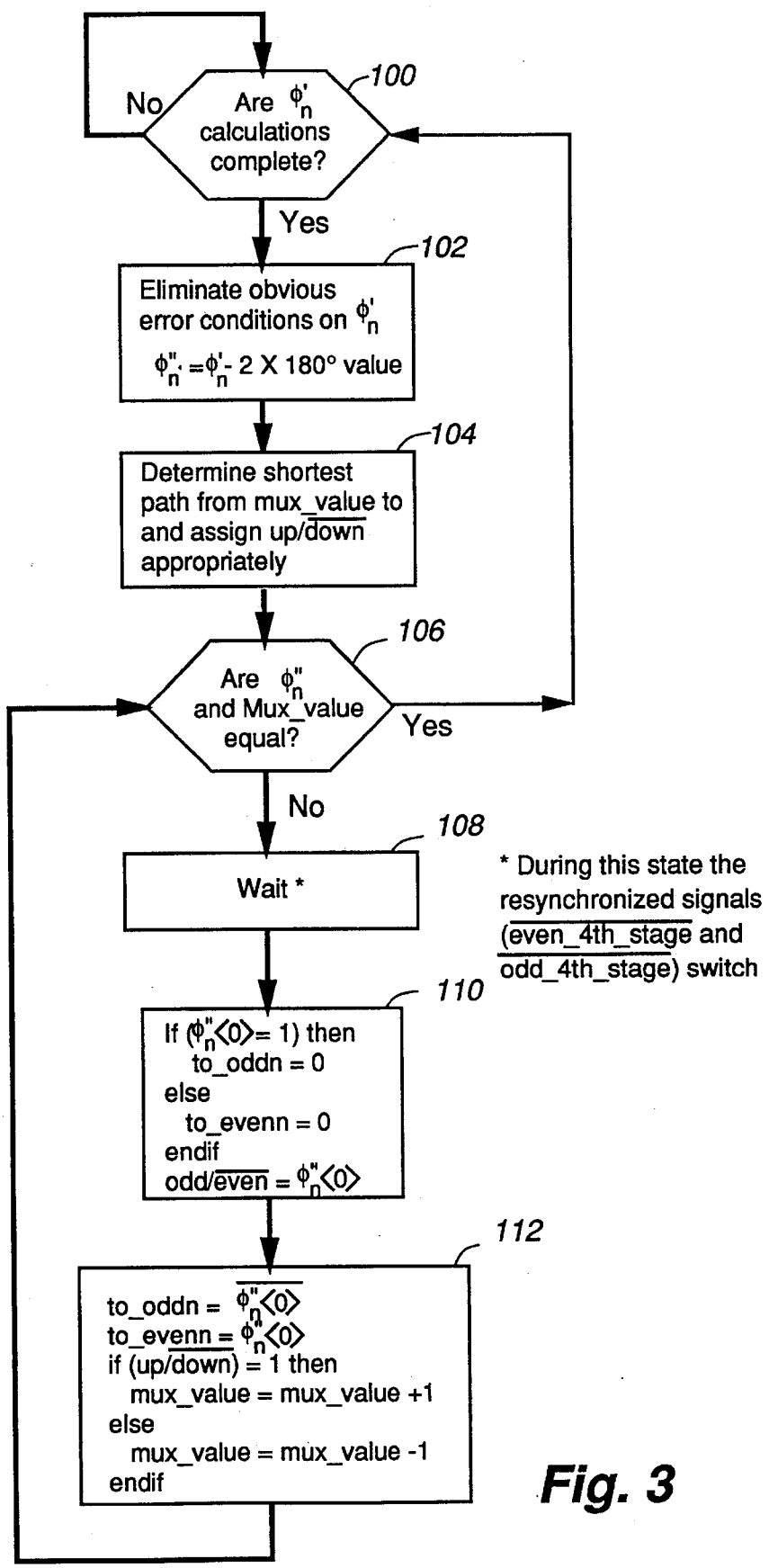
FIG. 3 illustrates, in a flow chart, a state machine for converting $\phi'_n$ to mux-value.
Figure 4:
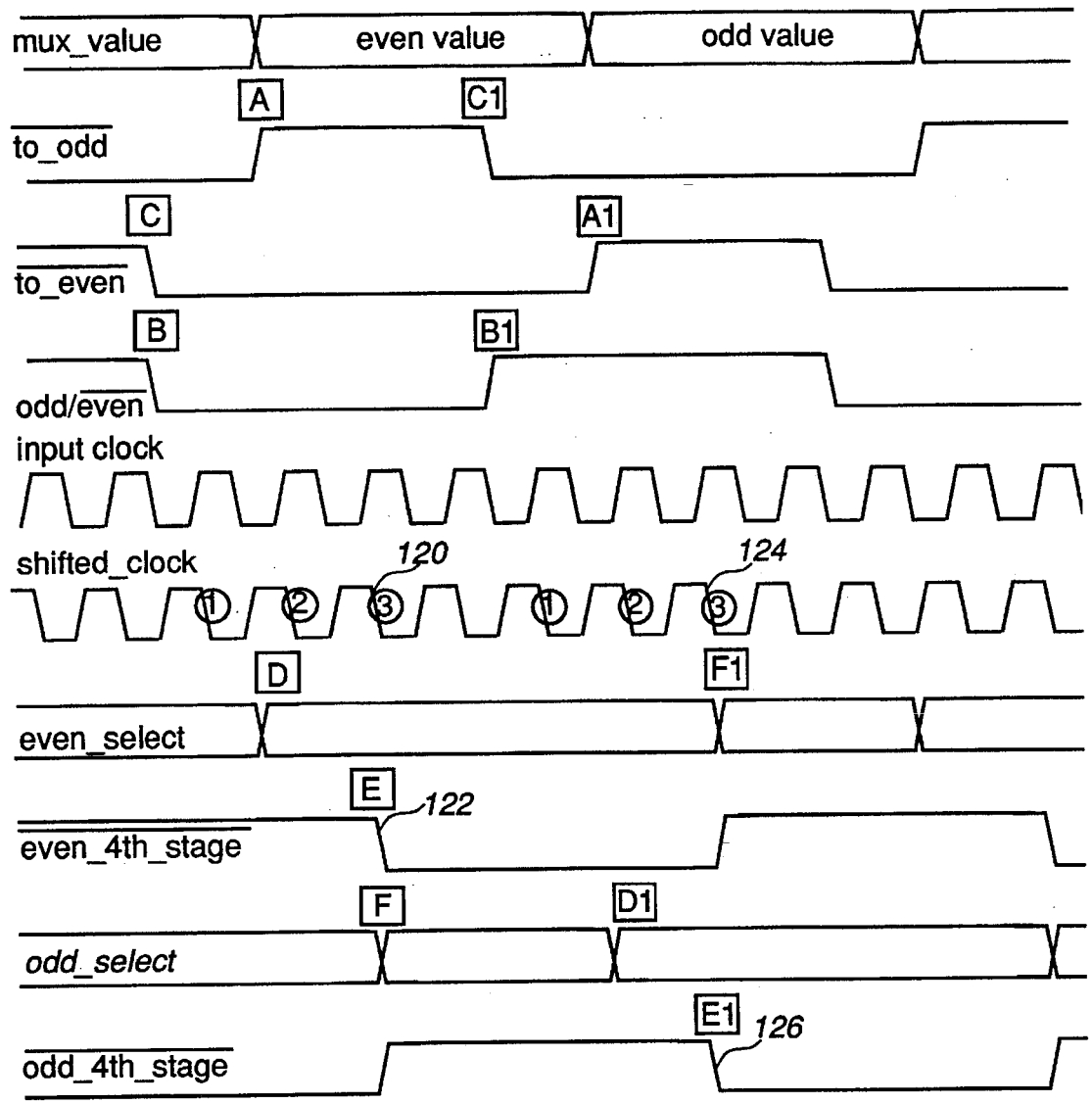
FIG. 4 graphically illustrates a timing diagram for the signals of FIG. 2.

Referring to FIG. 3, there is illustrated in a flow chart a state machine for converting $\phi'_n$ to mux-value of FIGS. 4 and 5. A block 100 queries whether calculations for $\phi'_n$ are complete, a No causes a loop back to the block 100. A Yes to the block 100 leads to a block 102 that eliminates obvious error conditions on $\phi'_n$ by setting $\phi_n''=\phi_n'-2\times18020$ value. A block 104 determines the shorter path from mux-value to $\phi_n''$ and assigns up/down approximately. A block 106 queries whether $\phi_n'$=mux-value. A Yes returns the state machine to the block 100. A No leads to a block 108 representing a wait state. During this wait state the resynchronized signals (NOT even-4th-stage) and (NOT odd-4th-stage) switch. Following the wait state a block 110 sets either to-oddn or to-evenn to equal zero dependent upon the value of $\phi_n''<0>$ unless odd/NOT even equals $\phi_n''<0>$. This leads to a block 112, that increments or decrements the mux-value by one in dependence upon the values of to_oddn, to_evenn and up/NOT down.

Referring to FIG. 4, there is graphically illustrated a timing diagram for the signals of FIG. 2. Multiplexor control circuits, not shown in FIGS. 1, 2, and 4, operating in accordance with the state flow diagram of FIG. 3 convert the multiplexor position and timing signals, mux_value, to_odd, to_even, and odd/NOT even, to select signals for all four stages of MUX 20. These select signals are even_select, NOT even_4th_stage, odd_select, and NOT odd_4th_stage.

The sequence of events labelled: A, B, C, D, E, F, A1, B1, C1, D1, E1, F1 on FIG. 4 represent a complete cycle for the MUX 20 that is an output from both the even multiplexor 52 and the odd multiplexor 50.

In detail, the sequence is as follows:
A) Latch the current odd value;
B) Schedule the mux clock output to switch in three clock periods 120 from now;
C) Open the even side latches so the even side buffers of the mux can be selected but not enabled yet;
D) Enable the even side buffers (but not the final stage);
E) Enable 122 final stage, mux output=even side;
F) Disable the whole odd side of mux (power down);
A1) Latch the even side latches;
B1) Schedule the mux clock to switch over in three clocks 124 from now;
C1) Release the old odd value;
D1) An odd mux value is applied to the mux input to prepare for switch over by enabling the odd side of the buffer (but not the final stage);
E1) Enable 126 final stage, mux/output=odd side; and
F1) Shut down the even side buffers.

Referring to FIG. 5 there is schematically illustrated the circuit for for converting the mux-value, odd/NOT even signals to even-select, odd-select, NOT even-4th-stage and NOT add-4th-stage. The circuit includes two D-type flip-flops 130 and 132 connected in series for converting the odd/NOT even signal to the not even 4th_stage and NOT odd_4th_stage signals. The D-type flip-flop 130 has applied to its D input 134 the odd/NOT even signal. The D-type flip-flop 132 has its D input 136 connected to the Q output 138 of D-type flip-flop 130. The clock inputs 140, 142 of D-type flip-flops 130 and 132, respectively, have the inverted shifted clock signal applied as input. The Q and not Q outputs 144 and 146 of the D-type flip-flop 132 provide the NOT even-4th-stage and NOT odd- 4th-stage signals respectively.

The circuit also includes a transparent latch 150 having a D input 152, a clock input 156 and a Q output 154 for providing the even-select signal. The mux-value signal is applied as input to the D input 152. The NOT even-4th-stage signal from D-type flip-flop 132 is applied as input to the clock input 156. The even-select signal is output from the Q output 154.

Similarly, a transparent latch 160 having a D input 162, a clock input 166 and a Q output 164 provides the odd-select signal. The mux-value signal is applied as input to the D input 162. The NOT odd-4th-stage signal is applied as input to the clock input 166. The odd-select signal is output from the Q output 164.

Numerous modifications, variations and adaptations may be made to the particular embodiment of the invention described above without departing from the scope of the invention, which is defined in the claims.

What is claimed is:

1. A method of providing a phase controlled clock signal, in an integrated circuit comprising the steps of:

providing an on-chip ring oscillator comprised of a plurality of predetermined gates for providing an internal reference clock signal having a clock signal period $T_{osc}$, the delay through each of the predetermined gates being dependent upon temperature, process, and voltage variations;

providing an external reference clock signal generated off-chip having a period $T_{ref}$, $T_{ref}$ being shorter than that of internal reference clock signal period, $T_{osc}$;

determining the number of external reference clock signal periods $T_{ref}$ in one internal reference clock signal period, $T_{osc}$;

determining the propagation delay through one of predetermined gates of the ring oscillator, the propagation delay being representative of the delay through other gates of the ring oscillator;

providing a phase select value indicative of a desired phase shift of the external reference clock signal;

providing a delay line having a plurality of delay gates, the propagation delay through each of the delay gates being substantially the same as the propagation delay through each of the predetermined gates of the ring oscillator and being equally dependent upon temperature, process, and voltage variations;

inputting the external reference clock signal info the delay line, tapping the delay line after each of the plurality of delay gates to provide a plurality of delayed external reference clock signals;

determining in dependence upon the phase select value, how many delay line gates, each having the determined propagation delay, are required to delay the external reference clock signal by the desired phase shift corresponding to the phase select value;

selecting a tap of the delay line which corresponds to the number of delay line gates determined in dependence upon the phase select value; and outputting the signal of the selected tap as the phase controlled clock signal.

2. The method as claimed in claim 1 further including the step of subtracting a predetermined fixed number of delay line gates, equal to and representative of additional delays introduced in the step of selecting, from the number of delay line gates determined in dependence upon the phase select value, and selecting a tap of the delay line which corresponds to the resultant number of gates.

3. The method as claimed in claim 1 or claim 2 further including the step of dividing the internal clock signal by an integral value 'n' to provide the internal reference clock signal having a period $nT_{osc}$.

4. Apparatus for providing a phase controlled clock signal on an integrated circuit comprising:

a ring oscillator comprised of a plurality of predetermined gates for providing an internal reference clock signal having a clock signal period $T_{osc}$, the delay through each of the predetermined gates being dependent upon temperature, process, and voltage variations;

an input for receiving an external reference clock signal having a period $T_{ref}$, $T_{ref}$ being shorter than that of internal reference clock signal period, $T_{osc}$;

means for determining the number of external reference clock signal periods $T_{ref}$ in one internal reference clock signal period, $T_{osc}$;

means for determining the propagation delay through one of predetermined gates of the ring oscillator, the propagation delay being representative of the delay through other gates of the ring oscillator;

an input for receiving a phase select value indicative of a desired phase shift of the external reference clock signal;

a multitapped delay line having a plurality of delay gates and a corresponding plurality of delay line taps, the propagation delay through each of the delay gates being substantially the same as the propagation delay through each of the predetermined gates of the ring oscillator and being equally dependent upon temperature, process, and voltage variations, the delay line having its input connected to the input which receives the external reference clock signal;

means for determining in dependence upon the phase select value, how many delay line gates, each having the determined propagation delay, are required to delay the external reference clock signal by the desired phase shift corresponding to the phase select value;

a multiplexer for selecting and outputting a signal on a fop of the delay line which corresponds to the number of delay line gates determined in dependence upon the phase select value, wherein the signal represents the phase control clock signal.

5. The apparatus as claimed in claim 4 wherein the means for determining, in dependence upon the phase select value, how many delay line gates are required to delay the external reference clock signal by the desired phase shift includes means for subtracting a predetermined fixed number of delay line gates, equal to and representative of additional delays introduced in the multiplexer, from the number of delay line gates determined in dependence upon the phase select value, and means for selecting a tap of the delay line which corresponds to the resultant number of gates.

6. The apparatus as claimed in claims 4 or 5 wherein the multiplexor includes an odd side and an even side, the odd side connected to outputs of odd taps of the multitapped delay line and the even side connected to outputs of even taps of the multitapped delay line.

7. The apparatus as claimed in claim 6 wherein the multiplexor includes four stages on each side.

8. The apparatus as claimed in claim 7 wherein the first three stages of each side are cascaded and have an input for enabling by first respective select signal.

9. The apparatus as claimed in claim 8 wherein the fourth stage is shared by each side, is connected to the first three stages of each side and has an inputs for enabling by second respective select signals.

\* \* \* \* \*